(12) United States Patent
Morikazu

(10) Patent No.: US 8,314,014 B2
(45) Date of Patent: Nov. 20, 2012

(54) LASER PROCESSING APPARATUS AND LASER PROCESSING METHOD

(75) Inventor: Hiroshi Morikazu, Ota-Ku (JP)

(73) Assignee: Disco Corporation, Tokyo (JP)

( * ) Notice: Subject to any disclaimer, the term of this patent is extended or adjusted under 35 U.S.C. 154(b) by 366 days.

(21) Appl. No.: 12/795,887

(22) Filed: Jun. 8, 2010

(65) Prior Publication Data

US 2010/0317172 A1    Dec. 16, 2010

(30) Foreign Application Priority Data

Jun. 10, 2009  (JP) .................................. 2009-139029

(51) Int. Cl.
*H01L 21/302*    (2006.01)
(52) U.S. Cl. .. 438/463; 438/795; 438/940; 257/E21.602
(58) Field of Classification Search .................. 438/463, 438/795, 940; 257/E21.602
See application file for complete search history.

(56) References Cited

U.S. PATENT DOCUMENTS

| | | | | |
|---|---|---|---|---|
| 6,159,825 | A * | 12/2000 | Henley et al. | 438/460 |
| 6,562,698 | B2 * | 5/2003 | Manor | 438/460 |
| 7,169,687 | B2 * | 1/2007 | Li et al. | 438/463 |
| 7,582,848 | B2 * | 9/2009 | Smart | 219/121.69 |
| 7,776,720 | B2 * | 8/2010 | Boyle et al. | 438/463 |
| 8,211,731 | B2 * | 7/2012 | Harley et al. | 438/57 |
| 2003/0109141 | A1 * | 6/2003 | Peiter et al. | 438/707 |
| 2005/0236378 | A1 * | 10/2005 | Boyle et al. | 219/121.67 |
| 2006/0249816 | A1 * | 11/2006 | Li et al. | 257/618 |
| 2007/0272668 | A1 * | 11/2007 | Albelo et al. | 219/121.72 |
| 2008/0029154 | A1 * | 2/2008 | Milshtein et al. | 136/256 |
| 2011/0129958 | A1 * | 6/2011 | Rekow et al. | 438/95 |
| 2011/0287607 | A1 * | 11/2011 | Osako et al. | 438/462 |
| 2011/0300665 | A1 * | 12/2011 | Harley et al. | 438/96 |

FOREIGN PATENT DOCUMENTS

JP    2007-019252    1/2007

* cited by examiner

*Primary Examiner* — George Fourson, III
(74) *Attorney, Agent, or Firm* — Greer, Burns & Crain Ltd.

(57) ABSTRACT

A laser processing apparatus including a laser beam applying unit. The laser beam applying unit includes a laser beam generating unit, a focusing unit, and an optical system for guiding a laser beam from the laser beam generating unit to the focusing unit. The optical system includes a first polarization beam splitter for splitting the laser beam generated from the laser beam generating unit into a first laser beam and a second laser beam, a half-wave plate inserted between the laser beam generating unit and the first polarization beam splitter, a first mirror for reflecting the first laser beam transmitted through the first polarization beam splitter to an optical path parallel to the optical path of the second laser beam, a second mirror for reflecting the second laser beam in a direction perpendicular to the direction of incidence of the second laser beam, and a second polarization beam splitter located at a position where the first laser beam reflected by the first mirror intersects the second laser beam reflected by the second mirror.

2 Claims, 8 Drawing Sheets

LASER PROCESSING APPARATUS AND LASER PROCESSING METHOD

BACKGROUND OF THE INVENTION

1. Field of the Invention

The present invention relates generally to a laser processing apparatus and a laser processing method for processing a workpiece, and more particularly to a laser processing apparatus and a laser processing method for a semiconductor wafer including a groove forming step of applying a laser beam to the semiconductor wafer along a plurality of division lines to thereby form a plurality of laser processed grooves along these division lines on the semiconductor wafer.

2. Description of the Related Art

In a semiconductor device fabrication process, a plurality of crossing division lines called streets are formed on the front side of a substantially disk-shaped semiconductor wafer such as a silicon wafer and a gallium arsenide wafer to partition a plurality of regions where devices such as ICs and LSIs are respectively formed. The semiconductor wafer is divided into the individual devices along the division lines by using a cutting apparatus or a laser processing apparatus, and these devices are widely used in various electrical equipment such as mobile phones and personal computers. In general, a dicing apparatus is used as the cutting apparatus. The dicing apparatus includes a cutting blade having a thickness of about 30 to 300 µm. The cutting blade is obtained by bonding super abrasive grains such as diamond and CBN with metal or resin. Cutting is performed by rotating the cutting blade at a high speed of about 30000 rpm and feeding the cutting blade into a semiconductor wafer.

On the other hand, the laser processing apparatus essentially includes a chuck table for holding a semiconductor wafer, laser beam applying means for applying a pulsed laser beam to the semiconductor wafer held on the chuck table, and feeding means for relatively feeding the chuck table and the laser beam applying means. The pulsed laser beam has an absorption wavelength to the semiconductor wafer, and it is applied to the semiconductor wafer along the division lines formed on the front side of the semiconductor wafer to thereby form a plurality of laser processed grooves along these division lines. After forming the laser processed grooves, an external force is applied to the semiconductor wafer to break the semiconductor wafer along the laser processed grooves, thereby dividing the semiconductor wafer into the individual devices (see Japanese Patent Laid-open No. 2007-19252, for example).

SUMMARY OF THE INVENTION

In the case of cutting the semiconductor wafer by using the dicing apparatus having the cutting blade as mentioned above, each device divided from the semiconductor wafer has a die strength of 800 MPa. To the contrary, in the case of dividing the semiconductor wafer by performing a conventional laser processing method, each device divided from the semiconductor wafer has a die strength of 400 MPa. Such a low die strength causes a degradation in quality of electrical equipment.

The present invention has been devised in view of the above circumstances, and it is therefore an object of the present invention to provide a laser processing method and a laser processing apparatus which can manufacture a device having a high die strength.

In accordance with an aspect of the present invention, there is provided a laser processing apparatus including a chuck table for holding a workpiece; laser beam applying means for applying a laser beam to said workpiece held on said chuck table; and feeding means for relatively feeding said chuck table and said laser beam applying means; said laser beam applying means including a laser beam generating unit; a first polarization beam splitter for splitting a laser beam generated from said laser beam generating unit into a first laser beam and a second laser beam; a first half-wave plate inserted between said laser beam generating unit and said first polarization beam splitter; a first mirror for reflecting said first laser beam transmitted through said first polarization beam splitter to an optical path parallel to the optical path of said second laser beam; a second mirror for reflecting said second laser beam in a direction perpendicular to the direction of incidence of said second laser beam; a second polarization beam splitter located at a position where said first laser beam reflected by said first mirror intersects said second laser beam reflected by said second mirror; and a focusing lens for focusing said first laser beam transmitted through said second polarization beam splitter and said second laser beam reflected by said second polarization beam splitter onto said workpiece held on said chuck table; wherein the peak energy density of said first laser beam to be focused by said focusing lens is set to a first predetermined value and the peak energy density of said second laser beam to be focused by said focusing lens is set to a second predetermined value lower than said first predetermined value by rotating said first half-wave plate under control.

Preferably, said laser beam applying means further includes a second half-wave plate inserted between said first mirror and said second polarization beam splitter and a third half-wave plate inserted between said first polarization beam splitter and said second mirror; the peak energy density of said first laser beam to be focused by said focusing lens is adjusted by rotating said second half-wave plate under control; and the peak energy density of said second laser beam to be focused by said focusing lens is adjusted by rotating said third half-wave plate under control.

Preferably, said laser beam applying means further includes first moving means for moving said first mirror in a direction parallel to the optical path of said first laser beam transmitted through said first polarization beam splitter and second moving means for moving said second mirror in a direction parallel to the optical path of said second laser beam reflected by said first polarization beam splitter; and the spacing between said first laser beam and said second laser beam to be focused by said focusing lens is adjusted by moving said first mirror through said first moving means or by moving said second mirror through said second moving means.

Preferably, said first predetermined value for the peak energy density of said first laser beam to be focused by said focusing lens is set to 250 GW/cm² or more, and said second predetermined value for the peak energy density of said second laser beam to be focused by said focusing lens is set to 5 to 200 GW/cm².

In accordance with another aspect of the present invention, there is provided a laser processing method for a wafer having individual devices in regions partitioned by a plurality of crossing division lines formed on said wafer, including a laser processed groove forming step of applying a first laser beam to said wafer held on a chuck table along said division lines to thereby form a plurality of laser processed grooves along said division lines, the peak energy density of said first laser beam being set to a first predetermined value; and a thermal strain removing step of applying a second laser beam to said wafer along said laser processed grooves to thereby remove thermal strain from said laser processed grooves, the peak energy density of said second laser beam being set to a second predetermined value lower than said first predetermined value.

Preferably, said first predetermined value is set to 250 GW/cm$^2$ or more, and said second predetermined value is set to 5 to 200 GW/cm$^2$.

According to the laser processing method of the present invention, the laser processed grooves are formed along the division lines on the wafer by using the first laser beam having a high peak energy density, and a thermal strain layer is removed from the side wall of each laser processed groove to thereby finish each laser processed groove by using the second laser beam having a low peak energy density. Accordingly, the die strength of each device divided from the wafer can be improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
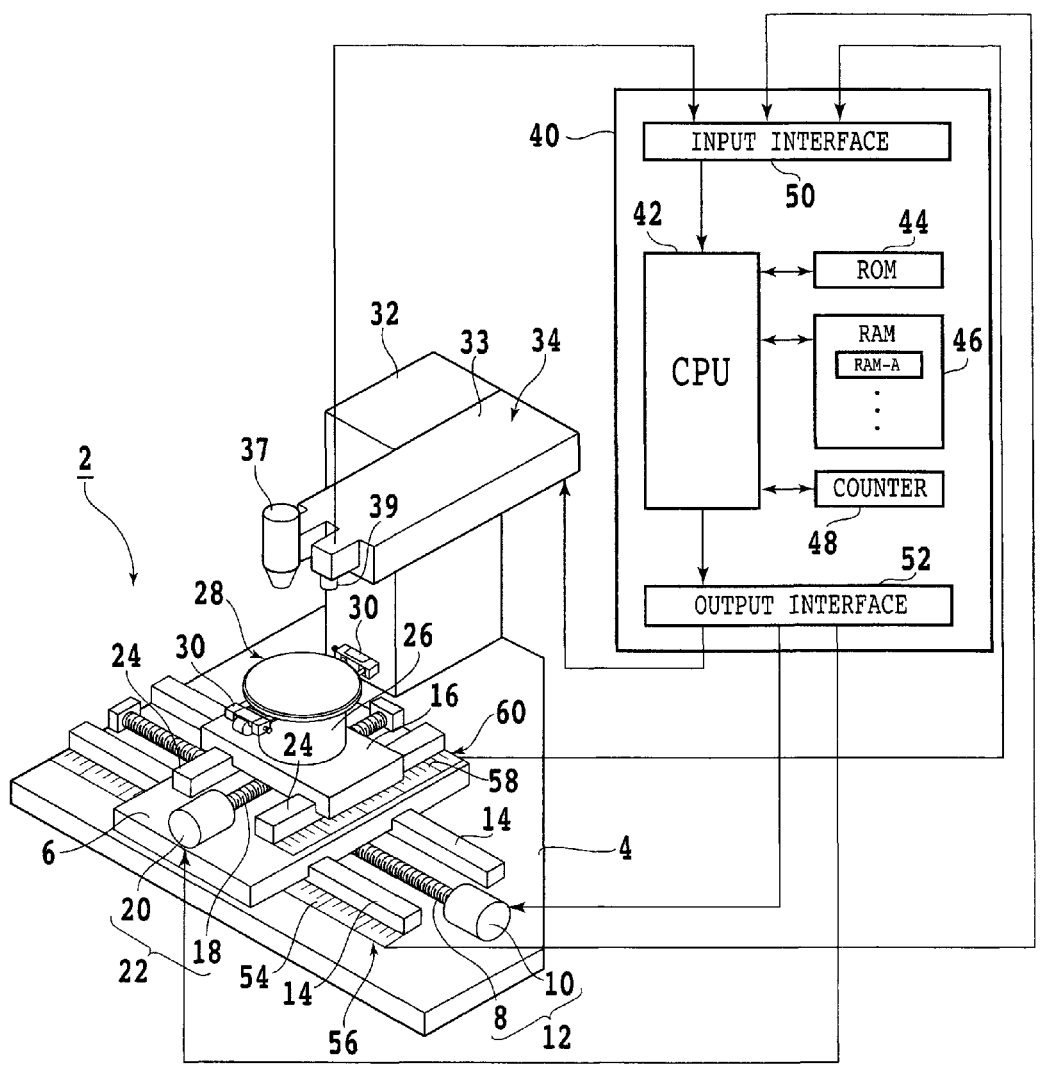
FIG. 1 is a schematic perspective view of a laser processing apparatus according to a preferred embodiment of the present invention.

A preferred embodiment of the present invention will now be described in detail with reference to the drawings. Referring to FIG. 1, there is shown a schematic perspective view of a laser processing apparatus according to a preferred embodiment of the present invention. The laser processing apparatus 2 includes a stationary base 4 and a first slide block 6 supported to the stationary base 4 so as to be movable in an X direction shown by an arrow X. The first slide block 6 is movable in a feeding direction, i.e., in the X direction along a pair of guide rails 14 by feeding means 12 including a ball screw 8 and a pulse motor 10. A second slide block 16 is supported to the first slide block 6 so as to be movable in a Y direction shown by an arrow Y. The second slide block 16 is movable in an indexing direction, i.e., in the Y direction along a pair of guide rails 24 by indexing means 22 including a ball screw 18 and a pulse motor 20.

A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping a semiconductor wafer held on the chuck table 28 under suction. A column 32 is provided on the stationary base 4, and a laser beam applying unit 34 is mounted on the column 32. The laser beam applying unit 34 includes a casing 33, a laser beam generating unit 35 (see FIG. 4) accommodated in the casing 33, an optical system 36 (see FIG. 4) accommodated in the casing 33, and focusing means 37 mounted at the front end of the casing 33.

Figure 3:
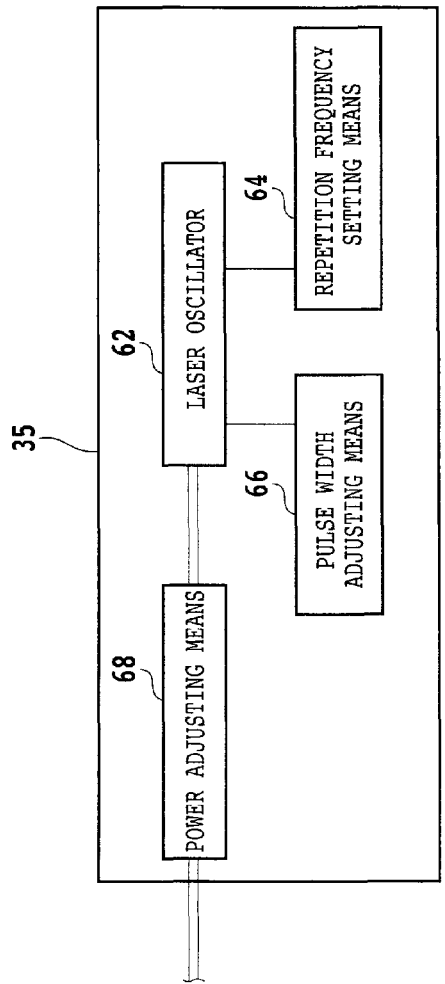
FIG. 3 is a block diagram of a laser beam generating unit.

As shown in FIG. 3, the laser beam generating unit 35 includes a laser oscillator 62 such as a YAG laser oscillator or a YVO4 laser oscillator, repetition frequency setting means 64, pulse width adjusting means 66, and power adjusting means 68. Although not shown, the laser oscillator 62 has a Brewster window, and it emits a laser beam of linearly polarized light.

Figure 4:
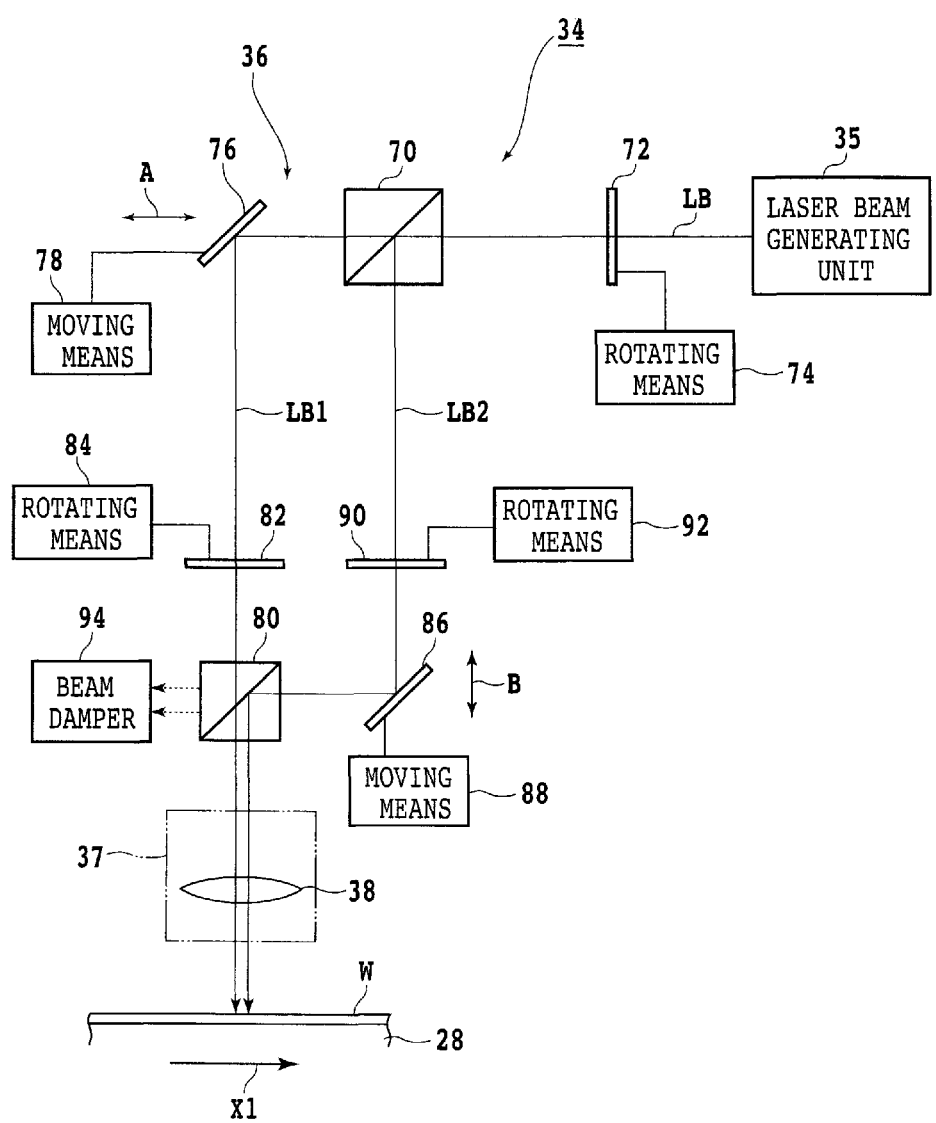
FIG. 4 is a block diagram of a laser beam applying unit.

The power of the laser beam emitted from the laser oscillator 62 is adjusted to a predetermined power by the power adjusting means 68 in the laser beam generating unit 35, and the laser beam from the laser beam generating unit 35 is introduced into the optical system 36 in the laser beam applying unit 34 shown in FIG. 4. The optical system 36 has a first polarization beam splitter 70 for splitting the laser beam LB generated from the laser beam generating unit 35 into a first laser beam LB1 of P-polarized light and a second laser beam LB2 of S-polarized light. The first laser beam LB1 is transmitted through the first polarization beam splitter 70, and the second laser beam LB2 is reflected by the first polarization beam splitter 70.

A first half-wave plate 72 is inserted between the laser beam generating unit 35 and the first polarization beam splitter 70. In general, a half-wave plate rotates the polarization plane of incident light by 180°-2θ when the angle of the optic axis of the half-wave plate with respect to the polarization plane of incident light is θ. Accordingly, when the first half-wave plate 72 is rotated by an angle α by using rotating means 74, the polarization plane of incident light is rotated by an angle 2α. Accordingly, by using the rotating means 74 to suitably rotate the first half-wave plate 72, the ratio in intensity between the first laser beam LB1 of P-polarized light and the second laser beam LB2 of S-polarized light to be output from the first polarization beam splitter 70 can be continuously changed.

The first laser beam LB1 of P-polarized light transmitted through the first polarization beam splitter 70 is reflected by a mirror 76 to propagate along an optical path parallel to the optical path of the second laser beam LB2 of S-polarized light reflected by the first polarization beam splitter 70. The mirror 76 is movable by moving means 78 in a direction shown by an arrow A, i.e., in a direction parallel to the optical path of the first laser beam LB1 transmitted through the first polarization beam splitter 70. The second laser beam LB2 of S-polarized light reflected by the first polarization beam splitter 70 is reflected by a mirror 86 to propagate in a direction perpendicular to the direction of incidence. The mirror 86 is movable by moving means 88 in a direction shown by an arrow B, i.e., in a direction parallel to the optical path of the second laser beam LB2 reflected by the first polarization beam splitter 70.

A second polarization beam splitter 80 is located at a position where the first laser beam LB1 reflected by the mirror 76 intersects the second laser beam LB2 reflected by the mirror 86. Like the first polarization beam splitter 70, the second polarization beam splitter 80 transmits a laser beam of P-polarized light and reflects a laser beam of S-polarized light. The first laser beam LB1 is almost composed of a P-polarized light component, so that it is transmitted through the second polarization beam splitter 80. On the other hand, the second laser beam LB2 is almost composed of an S-polarized light component, so that it is reflected by the second polarization beam splitter 80. The first laser beam LB1 transmitted through the second polarization beam splitter 80 and the second laser beam LB2 reflected by the second polarization beam splitter 80 are focused by a focusing lens 38 in the focusing means 37 onto a semiconductor wafer W held on the chuck table 28.

A second half-wave plate 82 is inserted between the mirror 76 and the second polarization beam splitter 80. By using rotating means 84 to rotate the second half-wave plate 82, the splitting ratio of the first laser beam LB1 to be emerged from the second polarization beam splitter 80 can be adjusted. A third half-wave plate 90 is inserted between the first polarization beam splitter 70 and the mirror 86. By using rotating means 92 to rotate the third half-wave plate 90, the splitting ratio of the second laser beam LB2 to be emerged from the second polarization beam splitter 80 can be adjusted.

In this preferred embodiment, the first laser beam LB1 is almost composed of a P-polarized light component, and the second laser beam LB2 is almost composed of an S-polarized light component. Accordingly, the second half-wave plate 82 and the third half-wave plate 90 are used to finely adjust the splitting ratios of the first laser beam LB1 and the second laser beam LB2. An S-polarized light component of the first laser beam LB1 reflected by the second polarization beam splitter 80 and a P-polarized light component of the second laser beam LB2 transmitted through the second polarization beam splitter 80 are absorbed by a beam damper 94.

In performing laser processing by using the laser beam applying unit 34 of the embodiment, the chuck table 28 is moved in the feeding direction shown by an arrow X1 in FIG. 4. At the same time, the first laser beam LB1 and the second laser beam LB2 are focused by the focusing lens 38 onto the wafer W held on the chuck table 28 to thereby perform laser processing on the wafer W. The first laser beam LB1 is focused at a position upstream of the second laser beam LB2 with respect to the feeding direction of the arrow X1. The spacing between the first laser beam LB1 and the second laser beam LB2 to be applied to the wafer W can be adjusted by using the moving means 78 to move the mirror 76 in the direction of the arrow A or by using the moving means 88 to move the mirror 86 in the direction of the arrow B. Preferably, the spacing between the focused spots of the first and second laser beams LB1 and LB2 on the wafer W is set in the range of 20 to 100 µm.

Referring back to FIG. 1, imaging means 39 for detecting a processing area of the semiconductor wafer W to be laser-processed is also provided at the front end of the casing 33 so as to be juxtaposed to the focusing means 37 in the X direction. The imaging means 39 includes an ordinary imaging device such as a CCD for imaging the processing area of the semiconductor wafer W by using visible light. The imaging means 39 further includes infrared imaging means composed of infrared light applying means for applying infrared light to the semiconductor wafer W, an optical system for capturing the infrared light applied to the semiconductor wafer W by the infrared light applying means, and an infrared imaging device such as an infrared CCD for outputting an electrical signal corresponding to the infrared light captured by the optical system. An image signal output from the imaging means 39 is transmitted to a controller (control means) 40.

The controller 40 is configured by a computer, and it includes a central processing unit (CPU) 42 for performing operational processing according to a control program, a read only memory (ROM) 44 preliminarily storing the control program, a random access memory (RAM) 46 for storing the results of computation, etc., a counter 48, an input interface 50, and an output interface 52.

Reference numeral 56 denotes feed amount detecting means including a linear scale 54 provided along one of the guide rails 14 and a read head (not shown) provided on the first slide block 6. A detection signal from the feed amount detecting means 56 is input into the input interface 50 of the controller 40. Reference numeral 60 denotes index amount detecting means including a linear scale 58 provided along one of the guide rails 24 and a read head (not shown) provided on the second slide block 16. A detection signal from the index amount detecting means 60 is input into the input interface 50 of the controller 40. An image signal from the imaging means 39 is also input into the input interface 50 of the controller 40. On the other hand, control signals are output from the output interface 52 of the controller 40 to the pulse motor 10, the pulse motor 20, and the laser beam applying unit 34.

Figure 2:
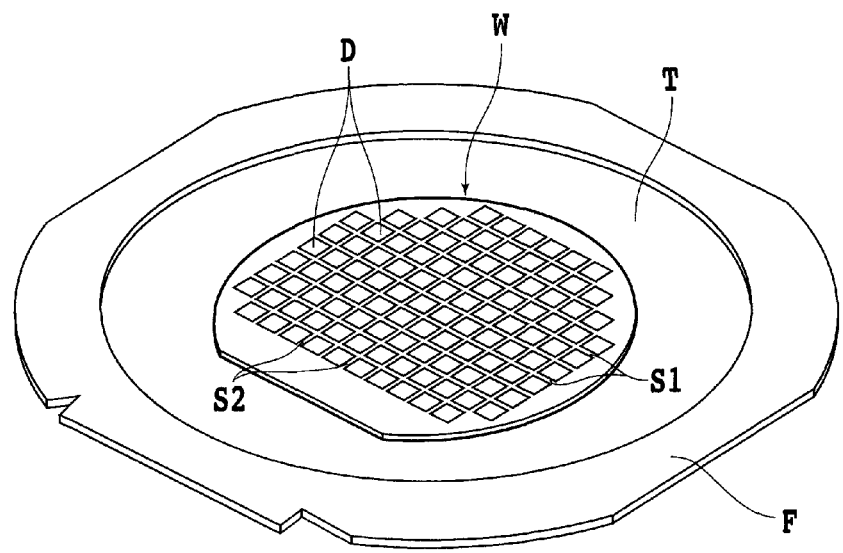
FIG. 2 is a perspective view of a semiconductor wafer supported through a dicing tape to an annular frame.

As shown in FIG. 2, the front side of the semiconductor wafer W as a workpiece to be processed by the laser processing apparatus 2 is formed with a plurality of first streets S1 and a plurality of second streets S2 perpendicular to the first streets S1, thereby partitioning a plurality of rectangular regions where a plurality of devices D are respectively formed. The wafer W is attached to a dicing tape T as an adhesive tape, and the dicing tape T is supported at its outer circumferential portion to an annular frame F. Accordingly, the wafer W is supported through the dicing tape T to the annular frame F. The wafer W is held on the chuck table 28 shown in FIG. 1 in the condition where the annular frame F is clamped by the clamps 30.

In the laser processing apparatus 2 according to the present invention, the first laser beam LB1 is applied to the semiconductor wafer W to thereby form a plurality of laser processed grooves along the division lines on the semiconductor wafer W (groove forming step), and the second laser beam LB2 is subsequently applied to the semiconductor wafer W to thereby finish the laser processed grooves formed by the first laser beam LB1 (groove finishing step). To efficiently form the laser processed grooves and sufficiently improve the die strength of each device D divided from the semiconductor wafer W, the peak energy density of the first laser beam LB1 and the peak energy density of the second laser beam LB2 must be set in predetermined ranges.

The primary object of the present invention is to improve the die strength of each device D obtained by dividing the semiconductor wafer W in the laser processing method using the laser processing apparatus 2, and the following test was carried out to examine the processing conditions for attaining a die strength of 800 MPa or more.

Pulsed laser beams having wavelengths of 1064 nm, 532 nm, and 355 nm were used and the pulse width of each pulsed laser beam was clamped to 30 ns, 10 ns, 5 ns, 3 ns, 2 ns, 1 ns, 100 ps, 50 ps, and 10 ps. In each pulse width, the power was changed to experimentally obtain an energy per pulse for attaining desired laser processing. This energy was divided by the pulse width and the spot area to thereby calculate a peak energy density. Then, the relation between the pulse width, the peak energy density, and the die strength was examined.

The peak energy density is given by the following equation.

$$\text{Peak energy density}(W/cm^2) = \text{Average power}(W) / [\text{Repetition frequency}(Hz) \times \text{Spot area}(cm^2) \times \text{Pulse width}(s)]$$

As a result, the following results were similarly obtained for all of the pulsed laser beams having the wavelengths of 1064 nm, 532 nm, and 355 nm.
(Test 1)

The semiconductor wafer was processed to form the laser processed grooves under the following conditions.

Repetition frequency: 10 kHz
    Average power: 0.1 W
    Pulse width: 2 ns
    Spot diameter: $\phi 10$ μm
    Feed speed: 10 mm/s
    Peak energy density: 6.35 $GW/cm^2$ The semiconductor wafer was next divided along the laser processed grooves to obtain the individual devices. The die strength of each device was measured to attain 800 MPa.
(Test 2)

The semiconductor wafer was processed to form the laser processed grooves under the following conditions.

Repetition frequency: 100 kHz
    Average power: 0.1 W
    Pulse width: 10 ps
    Spot diameter: $\phi 10$ μm
    Feed speed: 100 mm/s
    Peak energy density: 63.66 $GW/cm^2$ The semiconductor wafer was next divided along the laser processed grooves to obtain the individual devices. The die strength of each device was measured to attain 1800 MPa.
(Test 3)

The semiconductor wafer was processed to form the laser processed grooves under the following conditions.

Repetition frequency: 100 kHz
    Average power: 0.3 W
    Pulse width: 10 ps
    Spot diameter: $\phi 10$ μm
    Feed speed: 100 mm/s
    Peak energy density: 190.9 $GW/cm^2$ The semiconductor wafer was next divided along the laser processed grooves to obtain the individual devices. The die strength of each device was measured to attain 1000 MPa.
(Test 4)

The semiconductor wafer was processed to form the laser processed grooves under the following conditions.

Repetition frequency: 100 kHz
    Average power: 0.4 W
    Pulse width: 10 ps
    Spot diameter: $\phi 10$ μm
    Feed speed: 100 mm/s
    Peak energy density: 254.6 $GW/cm^2$ The semiconductor wafer was next divided along the laser processed grooves to obtain the individual devices. The die strength of each device was measured to attain 500 MPa.

From the results of Test 1 to Test 3, it has been found that a die strength of 800 MPa or more can be obtained when a laser beam having a pulse width of 2 ns or less and a peak energy density of 5 to 200 $GW/cm^2$ is applied to the semiconductor wafer W along the division lines to thereby form the laser processed grooves and the semiconductor wafer W is next divided along these laser processed grooves by using a dividing apparatus to obtain the individual devices. Accordingly, this laser beam is suitable for the groove finishing step. However, it has also been found that the depth of each laser processed groove is 5 to 10 μm, which is insufficient. Accordingly, this laser beam is not suitable for the groove forming step.

From the result of Test 4, it has been found that the die strength is less than a permissible value when a laser beam having a peak energy density of 250 $GW/cm^2$ or more is applied to the semiconductor wafer W along the division lines to thereby form the laser processed grooves and the semiconductor wafer W is next divided along these laser processed grooves by using the dividing apparatus to obtain the individual devices. Accordingly, this laser beam is not suitable for the groove finishing step. However, it has also been found that the depth of each laser processed groove is 30 to 60 μm, which is sufficient. Accordingly, this laser beam is suitable for the groove forming step.

Figure 5:
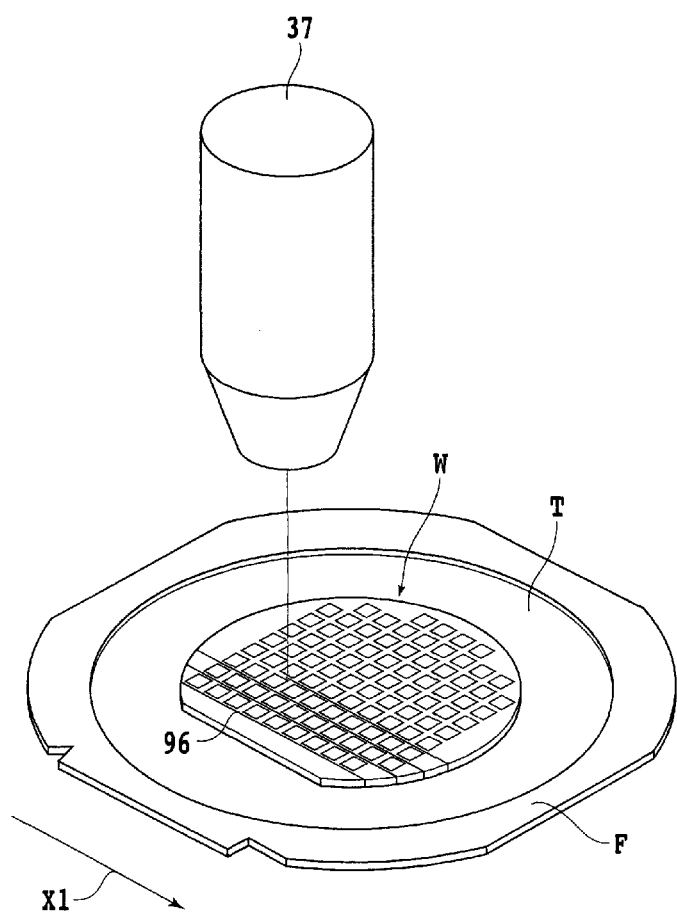
FIG. 5 is a perspective view for illustrating a laser processed groove forming step of a laser processing method according to the present invention.

A laser processing method using the laser processing apparatus 2 according to the present invention will now be described in detail with reference to FIGS. 4 to 8B. As shown in FIGS. 4 and 5, the first laser beam LB1 and the second laser beam LB2 each having an absorption wavelength to the semiconductor wafer W are focused by the focusing means 37 onto the front side of the semiconductor wafer W, and at the same time the chuck table 28 is moved in the direction of the arrow X1 at a predetermined feed speed.

Figure 6A:
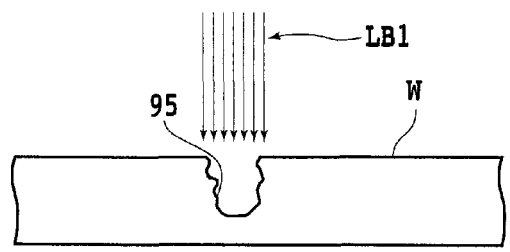
FIG. 6A is a sectional side view for illustrating a groove forming step using a first laser beam in the laser processing method.
Figure 6B:
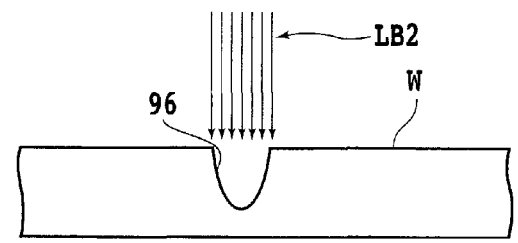
FIG. 6B is a sectional side view for illustrating a groove forming step using a second laser beam in the laser processing method.

As a result, a laser processed groove 95 is formed along a predetermined one of the streets S1 by the first laser beam LB1 as shown in FIG. 6A. Immediately after forming the laser processed groove 95, the groove finishing step is performed by the second laser beam LB2 to remove a thermal strain layer from the side wall of the laser processed groove 95, thus forming a finished laser processed groove 96 as shown in FIG. 6B. This operation is performed for all of the first streets S1 to form a plurality of laser processed grooves 96 along all of the first streets S1. Thereafter, the chuck table 28 is rotated 90° to similarly form laser processed grooves 96 along all of the second streets S2 perpendicular to the first streets S1. As a result, the laser processed grooves 96 are formed along all of the first and second streets S1 and S2 on the semiconductor wafer W.

It is to be noted that laser processing is performed under the following preferred conditions.

Light source: YAG pulsed laser or YVO4 pulsed laser
    Wavelength: 355 nm
    Average power: 0.5 W
    Pulse width: 10 ps
    Repetition frequency: 100 kHz
    Spot diameter: $\phi 10$ μm
    Feed speed: 100 mm/s The operation of the optical system 36 for obtaining optimum laser processing conditions will now be described with reference to FIG. 4. The laser beam LB of linearly polarized light having an average power of 0.5 W included in the above-mentioned processing conditions is emitted from the laser beam generating unit 35. This laser beam LB is split into the first laser beam LB1 having an average power of 0.4 W and the second laser beam LB2 having an average power of 0.1 W by the first polarization beam splitter 70 after suitably rotating the first half-wave plate 72 by using the rotating means 74.

The first laser beam LB1 is similar in processing conditions to the laser beam used in Test 4, so that the first laser beam LB1 is not suitable for the groove finishing step. However, since the peak energy density is high, the first laser beam LB1 is suitable for the groove forming step. On the other hand, the second laser beam LB2 is similar in processing conditions to the laser beam used in Test 2, so that the second laser beam LB2 is suitable for the groove finishing step for forming a device having a high die strength. Accordingly, the groove forming step is performed on the semiconductor wafer W by using the first laser beam LB1 having an average power of 0.4 W, and the groove finishing step is performed by using the second laser beam LB2 having an average power of 0.1 W, thereby forming the finished laser processed grooves 96 along all of the streets S1 and S2 formed on the semiconductor wafer W.

During this laser processing, the ratio between the P-polarized light component and the S-polarized light component of the first laser beam LB1 entering the splitting film of the second polarization beam splitter 80 is adjusted by using the rotating means 84 to rotate the second half-wave plate 82. Accordingly, only the P-polarized light component of the first laser beam LB1 is transmitted through the second polarization beam splitter 80, thereby finely adjusting the peak energy density of the first laser beam LB1 to be focused by the focusing lens 38. Similarly, the ratio between the S-polarized light component and the P-polarized light component of the second laser beam LB2 entering the splitting film of the second polarization beam splitter 80 is adjusted by using the rotating means 92 to rotate the third half-wave plate 90. Accordingly, only the S-polarized light component of the second laser beam LB2 is reflected by the second polarization beam splitter 80, thereby finely adjusting the peak energy density of the second laser beam LB2 to be focused by the focusing lens 38.

In the case of adjusting the spacing between the first laser beam LB1 and the second laser beam LB2 to be applied to the semiconductor wafer W, the mirror 76 is moved in the direction of the arrow A by the moving means 78, or the mirror 86 is moved in the direction of the arrow B by the moving means 88. Accordingly, the spacing between the first laser beam LB1 and the second laser beam LB2 can be adjusted to a desired value. The laser beam generating unit 35, the rotating means 74, 84, and 92, and the moving means 78 and 88 are connected to the controller 40 shown in FIG. 1 and controlled by the controller 40.

Figure 7:
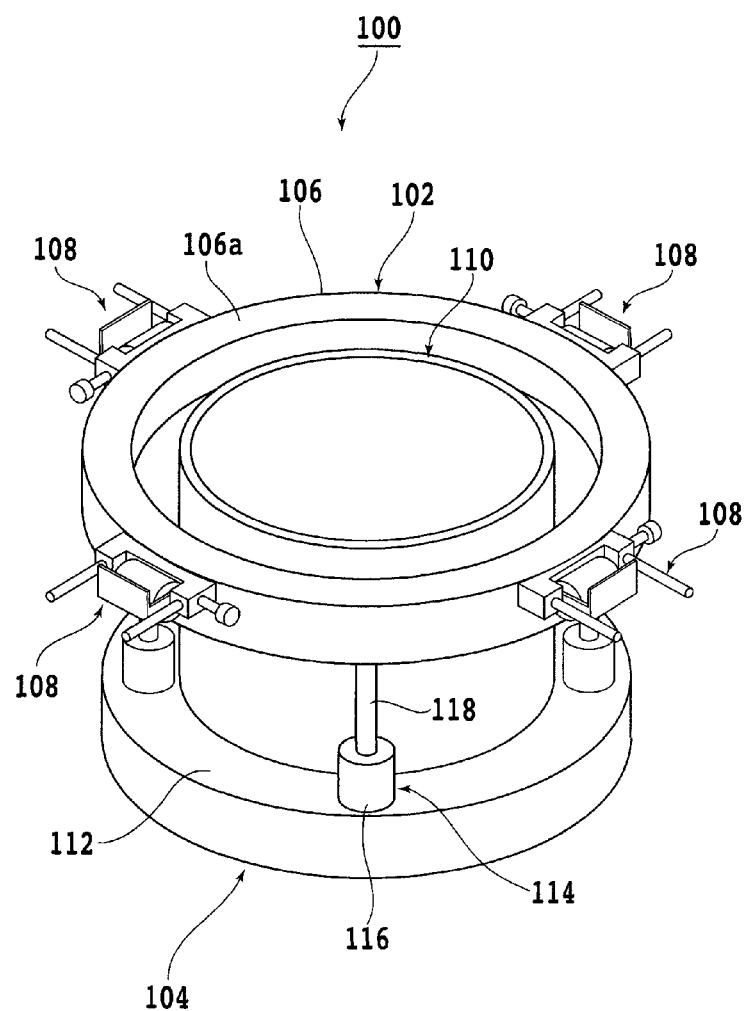
FIG. 7 is a perspective view of a dividing apparatus.

After forming the laser processed grooves 96 along all of the first and second streets S1 and S2 as mentioned above, a wafer dividing step is performed by using a dividing apparatus 100 shown in FIG. 7 in such a manner that the semiconductor wafer W is divided into the individual devices (chips) D along all of the laser processed grooves 96. The dividing apparatus 100 shown in FIG. 7 includes frame holding means 102 for holding the annular frame F and tape expanding means 104 for expanding the dicing tape T supported to the annular frame F held by the frame holding means 102.

The frame holding means 102 includes an annular frame holding member 106 and a plurality of clamps 108 as fixing means provided on the outer circumference of the frame holding member 106. The upper surface of the frame holding member 106 functions as a mounting surface 106a for mounting the annular frame F thereon. The annular frame F mounted on the mounting surface 106a is fixed to the frame holding member 106 by the clamps 108. The frame holding means 102 is supported by the tape expanding means 104 so as to be vertically movable.

The tape expanding means 104 includes an expanding drum 110 provided inside of the annular frame holding member 106. The expanding drum 110 has an outer diameter smaller than the inner diameter of the annular frame F and an inner diameter larger than the outer diameter of the semiconductor wafer W attached to the dicing tape T supported to the annular frame F. The expanding drum 110 has a supporting flange 112 integrally formed at the lower end of the drum 110. The tape expanding means 104 further includes driving means 114 for vertically moving the annular frame holding member 106. The driving means 114 is composed of a plurality of air cylinders 116 provided on the supporting flange 112. Each air cylinder 116 is provided with a piston rod 118 connected to the lower surface of the frame holding member 106. The driving means 114 composed of the plural air cylinders 116 functions to vertically move the annular frame holding member 106 so as to selectively take a reference position where the mounting surface 106a is substantially equal in height to the upper end of the expanding drum 110 and an expansion position where the mounting surface 106a is lower in height than the upper end of the expanding drum 110 by a predetermined amount.

Figure 8A:
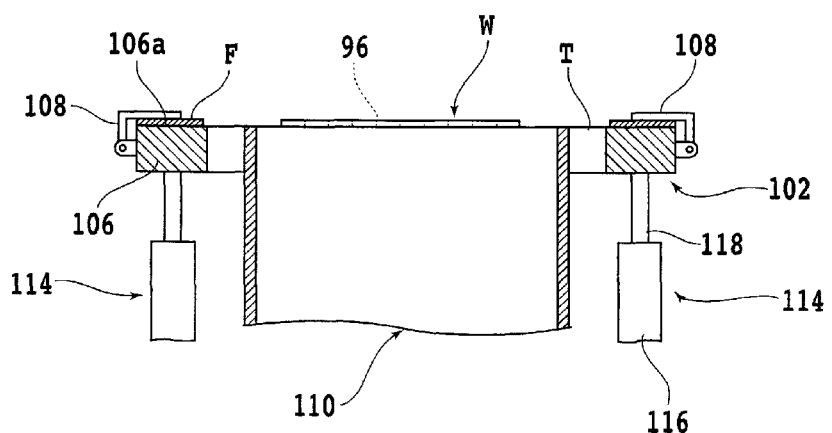
FIGS. 8A and 8B are sectional side views for illustrating a semiconductor wafer dividing step.

The wafer dividing step using the dividing apparatus 100 configured as described above will now be described with reference to FIGS. 8A and 8B. As shown in FIG. 8A, the annular frame F supporting the semiconductor wafer W through the dicing tape T is mounted on the mounting surface 106a of the frame holding member 106 and fixed to the frame holding member 106 by the clamps 108. At this time, the frame holding member 106 is set at the reference position where the height of the mounting surface 106a is substantially the same as that of the upper end of the expanding drum 110.

Figure 8B:
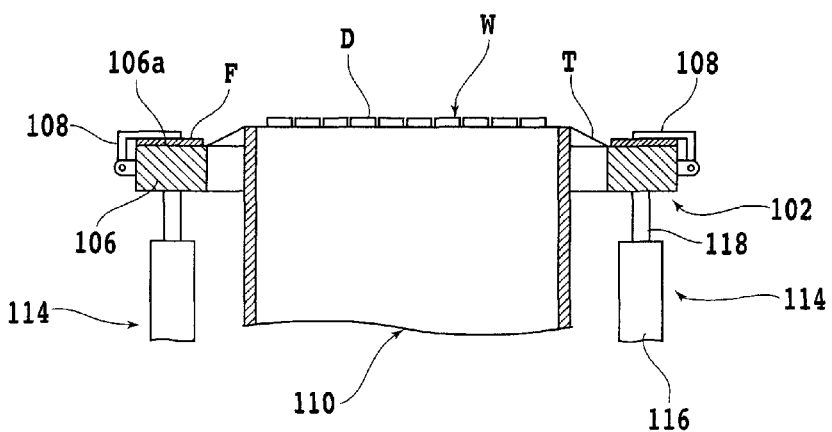

Thereafter, the air cylinders 116 are driven to lower the frame holding member 106 to the expansion position shown in FIG. 8B. Accordingly, the annular frame F fixed to the mounting surface 106a of the frame holding member 106 is also lowered, so that the dicing tape T supported to the annular frame F comes into abutment against the upper end of the expanding drum 110 and is expanded mainly in the radial direction of the expanding drum 110 as shown in FIG. 8B. As a result, a tensile force is radially applied to the semiconductor wafer W attached to the dicing tape T. When a tensile force is radially applied to the semiconductor wafer W, the semiconductor wafer W is broken along the laser processed grooves 96, thereby dividing the semiconductor wafer W into the individual semiconductor chips (devices) D.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method for a wafer having individual devices in regions partitioned by a plurality of crossing division lines formed on said wafer, comprising:
    a laser processed groove forming step of applying a first laser beam to said wafer held on a chuck table along said division lines to thereby form a plurality of laser processed grooves along said division lines, the peak energy density of said first laser beam being set to a first predetermined value; and
    a thermal strain removing step of applying a second laser beam to said wafer along said laser processed grooves to thereby remove thermal strain from said laser processed grooves, the peak energy density of said second laser beam being set to a second predetermined value lower than said first predetermined value.

2. The laser processing method according to claim 1, wherein said first predetermined value is set to 250 GW/cm$^2$ or more, and said second predetermined value is set to 5 to 200 GW/cm$^2$.

* * * * *